United States Patent
Su

(10) Patent No.: US 8,903,339 B2
(45) Date of Patent: Dec. 2, 2014

(54) GAIN ADJUSTMENT DEVICE AND GAIN ADJUSTMENT METHOD CIRCUIT FOR WIRELESS COMMUNICATION CIRCUIT FOR WIRELESS COMMUNICATION CIRCUIT

(75) Inventor: Chin Su, Kaohsiung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 185 days.

(21) Appl. No.: 13/609,291

(22) Filed: Sep. 11, 2012

(65) Prior Publication Data
US 2014/0055198 A1     Feb. 27, 2014

(30) Foreign Application Priority Data
Aug. 22, 2012   (TW) .............................. 101130490 A

(51) Int. Cl.
 *H04B 17/02*   (2006.01)
(52) U.S. Cl.
 USPC ...................... 455/136; 455/115.1; 455/115.2; 455/127.2; 455/226.1
(58) Field of Classification Search
 CPC ..... H03G 3/20; H04B 17/001; H04B 17/0045
 USPC .......... 455/67.11, 67.14, 115.1, 115.2, 127.2, 455/226.1, 232.1, 234.1, 240.1, 245.1, 455/251.1
 See application file for complete search history.

(56) References Cited

U.S. PATENT DOCUMENTS 7,181,205 B1 * 2/2007 Scott et al. .................... 455/423
2007/0054699 A1 * 3/2007 Ding et al. .................... 455/561

* cited by examiner

*Primary Examiner* — Tuan Pham
(74) *Attorney, Agent, or Firm* — Winston Hsu; Scott Margo

(57) ABSTRACT

A gain adjustment device for a wireless communication circuit comprising a transmission circuit and a reception circuit includes a signal generator and a gain adjustment circuit. The signal generator is coupled to the transmission circuit, and arranged for generating a test signal to the transmission circuit. The test signal transmitted through a printed circuit board such that the reception circuit coupled to the transmission circuit generates a corresponding reception signal in response to the test signal. The gain adjustment circuit is coupled to the reception circuit and the transmission circuit, and arranged for adjusting a transmitter gain configuration and a receiver gain configuration of the wireless communication circuit according to the reception signal.

10 Claims, 2 Drawing Sheets

US 8,903,339 B2

GAIN ADJUSTMENT DEVICE AND GAIN ADJUSTMENT METHOD CIRCUIT FOR WIRELESS COMMUNICATION CIRCUIT FOR WIRELESS COMMUNICATION CIRCUIT

BACKGROUND OF THE INVENTION

1. Field of the Invention

The present invention relates to gain adjustment for a wireless communication circuit, and more particularly, to a gain adjustment device for a wireless communication circuit using linearity of power of a reception signal and related gain adjustment method thereof.

2. Description of the Prior Art

In general, for a radio frequency (RF) integrated circuit (IC), the gain of the RF IC should be fixed once being manufactured. However, the differences (e.g., different lengths of traces, variations of permittivity, etc.) between the printed circuit boards, temperature variations, different production batches, or different environments in which the RF IC is used are all likely to cause the gain of the RF IC to shift. The gain shift of the RF IC will worsen linearity of a power amplifier, making I/Q-mismatch at the transmitter end more complicated, and therefore affecting the performance of calibration at the receiver end.

Thus, there is a need to provide a method and device to automatically locate the gain shift and a corresponding adjustment parameter, to ensure the linearity of the transmitter, such that the RF front-end may yield a proper signal to noises ratio (SNR) to thereby mitigate transmission quality deterioration caused by an I/Q-mismatched environment.

SUMMARY OF THE INVENTION

In accordance with exemplary embodiments of the present invention, a gain adjustment device for a wireless communication circuit using linearity of power of a reception signal and related gain adjustment method thereof are proposed to solve the above-mentioned problem.

According to an aspect of the present invention, an exemplary gain adjustment device for a wireless communication circuit is disclosed. The wireless communication circuit is comprised of a transmission circuit and a reception circuit. The exemplary gain adjustment device includes a signal generator and a gain adjustment circuit. The signal generator is coupled to the transmission circuit, and arranged for generating a test signal to the transmission circuit. The test signal transmitted through a printed circuit board such that the reception circuit coupled to the transmission circuit generates a corresponding reception signal in response to the test signal. The gain adjustment circuit is coupled to the reception circuit and the transmission circuit, and arranged for adjusting a transmitter gain configuration and a receiver gain configuration of the wireless communication circuit according to the reception signal.

According to another aspect of the present invention, an exemplary gain adjustment method of for a wireless communication circuit is disclosed. The wireless communication circuit is comprised of a transmission circuit and a reception circuit. The exemplary gain adjustment method includes generating a test signal to the transmission circuit such that the reception circuit coupled to the transmission circuit generates a corresponding reception signal in response to the test signal; and adjusting a transmitter gain configuration of the wireless communication circuit according to the reception signal.

In this way, it is possible to locate a compatible parameter for adjustment in an I/Q calibration circuit, automatically, in order to substitute for regular manual labors of finding unknown gain shifting in a batch of new products.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
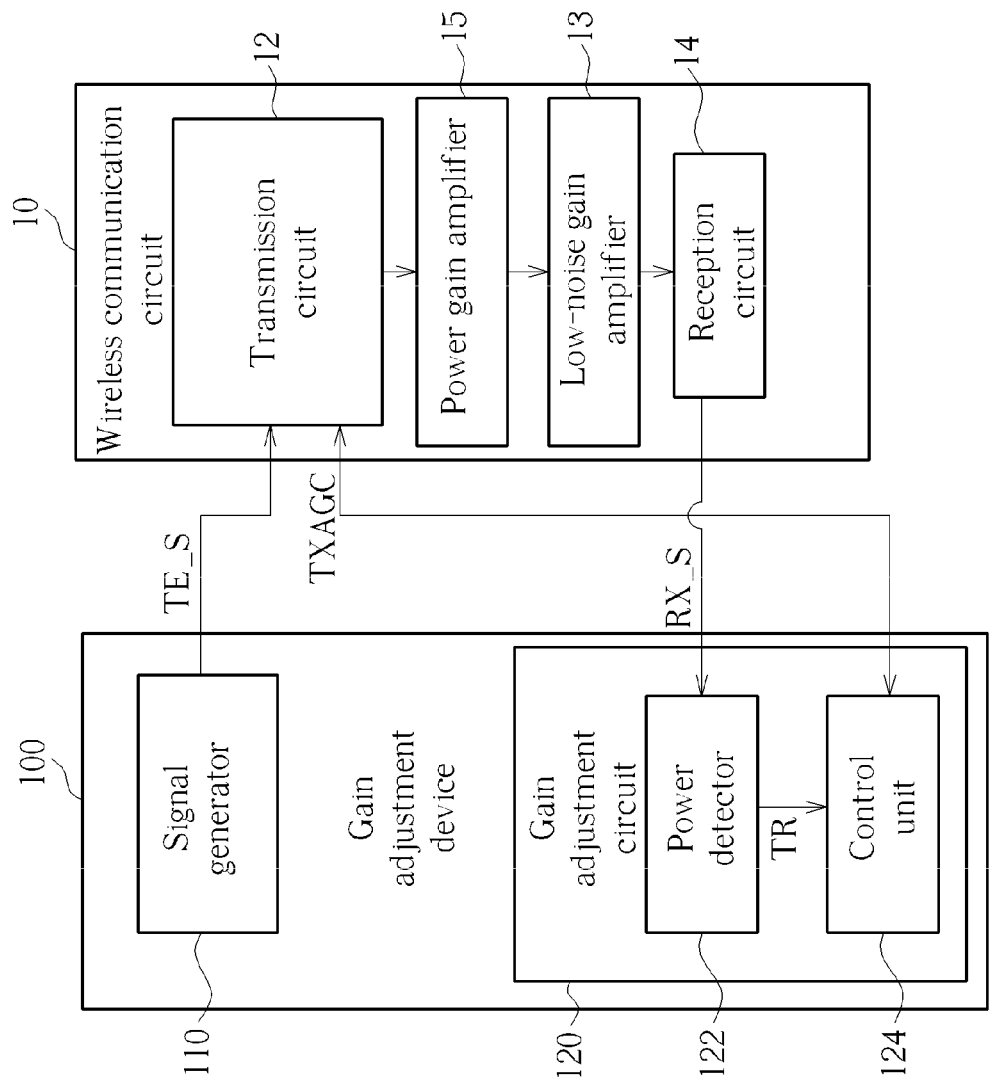
FIG. 1 is a schematic diagram illustrating a gain adjustment device according to an embodiment of the present invention.

Please refer to FIG. 1, which is a schematic diagram illustrating a gain adjustment device according to an embodiment of the present invention. The gain adjustment device 100 is utilized for a wireless communication circuit 10. The wireless communication circuit 10 includes a transmission circuit 12 and a reception circuit 14 to respectively transmit and receive baseband signals. The gain adjustment device 100 includes a signal generator 110 and a gain adjustment circuit 120. The signal generator 110 is coupled to the transmission circuit 12, and arranged for generating a test signal TE_S to the transmission circuit 12, such that the reception circuit 14 coupled to transmission circuit 12 generates a corresponding reception signal RX_S in response to the test signal TE_S. The reception circuit 14 and the transmission circuit 12 are connected via a loopback path such that the output of the transmission circuit 12 may be fed into the reception circuit 14. For example, the transmission circuit 12 may be coupled to a power gain amplifier 15. The output of the power gain amplifier 15 is coupled to a low-noise gain amplifier 13 via a switch. In one embodiment, the power gain amplifier 15 feeds the test signal TE_S via a printed circuit board (not shown) to the low-noise gain amplifier 13. In normal operation, the wireless communication circuit 10 transmits output signals, amplified by the power gain amplifier 15, by a antenna, and receives input signals by the antenna and then amplifies the received input signals by the low-noise gain amplifier 13. The gain adjustment circuit 120 includes a power detector 122 and a control unit 124. The power detector 122 is coupled to the reception circuit 14, and arranged for detecting a power level of the reception signal RX_S and accordingly generating a detection result TR. The control unit 124 is coupled to the power detector 122, and arranged for adjusting a transmitter gain configuration TXAGC of the transmission circuit 12 or the power gain amplifier 15, or adjusting a receiver gain configuration RXAGC (not shown) of the reception circuit 14 or the low-noise gain amplifier 13 according to detection result TR.

The test signal TE_S may be an anti-ramp signal, which is synthesized by a plurality of sinusoidal waves S1-SN. The sinusoidal waves S1-SN have different predetermined power levels L1-LN, respectively. The power detector 122 detects a plurality of power levels L1'-LN' in the reception signal RX_S which correspond to the power levels L1-LN, respectively, and accordingly generates the detection result TR. For example, the power detector 122 may generate a detection result TR by determining linearity of the power levels L1'-LN'. When the detection result TR indicates that the power levels L1'-LN' are non-linear, the control unit 124 adjusts the transmitter gain configuration TXAGC to decrease the transmitter gain, and when the detection result TR indicates that the power levels L1'-LN' are linear, the control unit 124 adjusts the transmitter gain configuration TXAGC to increase the transmitter gain or adjusts the receiver gain configuration RXAGC to increase the receiver gain. However, the above is for illustrative purposes only, and not meant to be limitations of the present invention.

For example, assuming that in the beginning, the test signal TE_S includes sinusoidal waves with power levels L1-L3 which are −7 db, −4 db and −1 db, respectively, the low-noise gain amplifier 13 is operating at a median gain, and the reception circuit 14 is operating at a gain under 2 db. At this moment, the power detector 122 will first determine a difference P1 between power level L2' and power level L1' and a difference P2 between power level L2' and power level L3' of the reception signal RX_S, and then compares the difference P1 and the difference P2 with a threshold T (e.g., 2.5 db), respectively. The comparison result is defined as an event E1 and an event E2, respectively. In this embodiment, a logic value of the event E1 is determined based on the comparison result of the difference P1 and the threshold T (e.g., when P1>T, E1=1; when P1<=T, E1=0), and a logic value of the event E2 is determined based on the comparison result of the difference P2 and the threshold T (e.g., when P2>T, E2=1; when P2<=T, E2=0). If the event E1 and the event E2 indicate that the difference P1 and the difference P2 are concurrently greater than the threshold T (i.e., (E1&E2)=1), it means that the power levels L1'-L3' are linear. On the other hand, if the event E1 and the event E2 indicate that the difference P1 and the difference P2 are not concurrently greater than the threshold T (i.e., one of the difference P1 and the difference P2 is less than or equal to the threshold T or the difference P1 and the difference P2 are both less than or equal to the threshold T, that is, (E1&E2)=0), it means that the power levels L1'-L3' are non-linear. When the power levels L1'-L3' are linear, the transmitter gain configuration TXAGC is increased by one unit, to exploit a higher transmitter gain under a premise that the power levels L1'-L3' are linear. Next, the reception circuit 14 generates a new reception signal RX_S according to the new transmitter gain configuration TXAGC. The above-mentioned processes is repeated such that the gain adjustment device 100 may constantly adjust the transmitter gain configuration TXAGC until the power levels L1'-L3' become non-linear. At this moment, it is recognized that the previous adjusted transmitter gain configuration TXAGC yields the maximum transmitter gain allowed under the condition where the power levels L1'-L3' stay linear. Hence, the transmitter gain configuration TXAGC is decreased by one unit, and the adjustment operation of the gain adjustment device 100 ends.

However, before any adjustment made to the transmitter gain configuration TXAGC, it is required to determine whether the transmitter gain configuration TXAGC is a boundary value MAX (the boundary value MAX of the transmitter gain configuration TXAGC is defined as $2^n-1$, wherein n is the number of power levels). In this embodiment, since the reception signal RX_S has three power levels L1'-L3', and thus the boundary value MAX of the transmitter gain configuration TXAGC is 7 (i.e., the maximum value of the transmitter gain configuration TXAGC allowed by the transmission circuit 12 is 7). If the event E1 and the event E2 indicate that the power levels L1'-L3' are linear, but the transmitter gain configuration TXAGC is 7, it means that the transmitter gain has already been adjusted to the maximum level for the transmission circuit 12. That is, at this moment, quality of the reception signal RX_S may not be further improved by tuning up the transmitter gain of the transmission circuit 12, and thus the adjustment operation of the gain adjustment device 100 ends.

On the other hand, if the transmitter gain configuration TXAGC is initially $2n^{-1}-1$, and the event E1 and the event E2 indicate that the power levels L1'-L3' are non-linear, the control unit 124 will directly set the transmitter gain configuration TXAGC to the lowest value 0, such that the reception circuit 14 generates a new reception signal RX_S. Next, the gain adjustment device 100 may tune up the transmitter gain configuration TXAGC by one unit through the above-mentioned process, so as to locate the maximum value of the transmitter gain configuration TXAGC allowed by the transmission circuit 12 under the premise that the power levels L1'-L3' are linear. Please note that, in this process, since the transmitter gain configuration TXAGC is directly set to the lowest value 0 from an initial value INI (e.g., $2^{n-1}=4$), it is sensible to exclude situations where the transmitter gain configuration TXAGC is greater than or equal to the initial value INI. That is, in addition to determining whether the transmitter gain configuration TXAGC is a boundary value MAX before adjusting the transmitter gain configuration TXAGC, it is also required to determine whether the transmitter gain configuration TXAGC is the initial value INI minus one unit (i.e., the first configuration $2^{n-1}-1$ which is smaller than the initial value INI). In addition, if the transmitter gain configuration TXAGC is directly set to 0, and the event E1 and the event E2 still indicate that the power levels L1'-L3' are non-linear, it means that the transmitter gain has already been adjusted to the minimum level for transmission circuit 12 under the current gain configuration of the low-noise gain amplifier 13, and the quality of the reception signal RX_S is still poor. Therefore, the low-noise gain amplifier 13 will switch to a lower gain configuration, and a new set of test signals TE_S is employed to re-initiate the above-mentioned process again.

Please refer to FIG. 6, which is a flowchart of a gain adjustment method according to an embodiment of the present invention. The gain adjustment method may be employed by the gain adjustment device 100 as shown in FIG. 1. Please note that, if the result is substantially the same, the steps are not required to be executed in the exact order shown in FIG. 2. The gain adjustment method may be briefly summarized as follows:

Step 200: Start.

Step 201: Set the transmitter gain configuration TXAGC to the initial value INI.

Step 202: Determine the difference P1 and the difference P2 according to the power levels L1'-L3' of the reception signal RX_S.

Step 203: Determine the event E1 and the event E2 according to the difference P1 and the difference P2, and determine linearity based on the logic values of the event the E1 and the event E2 (i.e., determine whether the event E1 and the event E2 happen concurrently). If (E1&E2)=1, go to step 204; otherwise, go to step 206.

Step 204: Determine whether the transmitter gain configuration TXAGC is the boundary value MAX or the initial value INI minus one unit. If yes, go to step 211; otherwise, go to step 205.

Step 205: Tune up the transmitter gain configuration TXAGC by one unit, and go to step 202.

Step 206: Determine whether the transmitter gain configuration TXAGC is the initial value INI. If yes, go to step 208; otherwise, go to step 207.

Step 207: Tune down the transmitter gain configuration TXAGC by one unit, and go to step 211.

Step 208: Set the transmitter gain configuration TXAGC to be 0, and go to step 202.

Step 209: If the transmitter gain configuration TXAGC is not the initial value INI and TXAGC=0, go to step 210.

Step 210: Switch the low-noise gain amplifier 13 to a lower gain configuration, and go to step 201.

Step 211: End.

Please note that, step 209 is implemented for checking whether the event E1 and the event E2 still indicate that the power levels L1'-L3' are non-linear after the transmitter gain configuration TXAGC is set to 0. However, during the gain adjustment process, since checking whether the event E1 and the event E2 indicate that the power levels L1'-L3' are non-linear is performed first, and checking whether the transmitter gain configuration TXAGC is 0 is performed later, the transmitter gain configuration TXAGC would never be a non-zero value in step 209.

Figure 2:
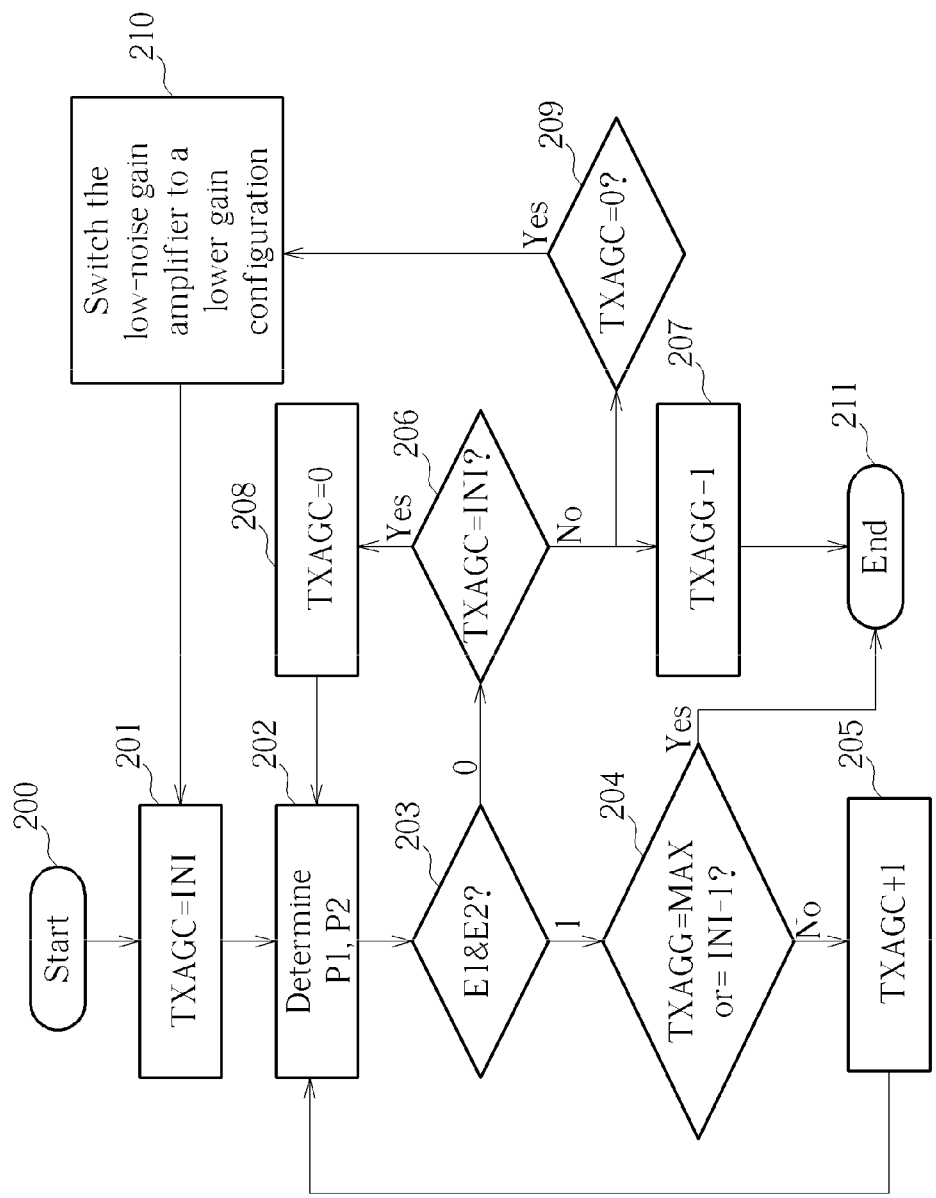
FIG. 2 is a flowchart of a gain adjustment method according to an embodiment of the present invention.

As those skilled in the art should readily understand operations of the steps in FIG. 2 after reading above paragraph, detailed description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gain adjustment device for a wireless communication circuit, the wireless communication circuit comprising a transmission circuit and a reception circuit, the gain adjustment device comprising:
   a signal generator, coupled to the transmission circuit, for generating a test signal to the transmission circuit, wherein the test signal is an anti-ramp signal including a plurality of sinusoidal waves with different predetermined power levels, and is transmitted through a printed circuit board (PCB) such that the reception circuit coupled to the transmission circuit generates a corresponding reception signal in response to the test signal; and
   a gain adjustment circuit, comprising:
      a power detector, coupled to the reception circuit, for detecting a plurality of power levels corresponding to the different predetermined power levels in the reception signal, respectively and accordingly generates a detection result; and
      a control unit, coupled to the power detector and the transmission circuit, for adjusting the transmitter gain configuration and the receiver gain configuration according to the detection result.

2. The gain adjustment device of claim 1, wherein the wireless communication circuit further comprises a low-noise-gain amplifier, and the control unit adjusts the receiver gain configuration of the low-noise-gain amplifier according to the detection result.

3. The gain adjustment device of claim 1, wherein the power detector determines linearity of power of the reception signal to generate the detection result.

4. The gain adjustment device of claim 3, wherein when the detection result indicates that the power of the reception signal is non-linear, and the control unit adjusts the transmitter gain configuration to decrease the transmitter gain.

5. The gain adjustment device of claim 3, wherein when the detection result indicates that the power of the reception signal is linear, and the control unit adjusts the transmitter gain configuration to increase the transmitter gain.

6. A gain adjustment method for a wireless communication circuit, the wireless communication circuit comprising a transmission circuit and a reception circuit, the gain adjustment method comprising:
   generating a test signal to the transmission circuit such that the reception circuit coupled to the transmission circuit generates a corresponding reception signal in response to the test signal, wherein the test signal is an anti-ramp signal including a plurality of sinusoidal waves with different predetermined power levels; and
   adjusting a transmitter gain configuration of the wireless communication circuit according to the reception signal, comprising:
      detecting a plurality of power levels corresponding to the different predetermined power levels in the reception signal, respectively, and accordingly generating a detection result; and
      adjusting the transmitter gain configuration according to the detection result.

7. The gain adjustment method of claim 6, wherein the wireless communication circuit further comprises a low-noise gain amplifier, and the gain adjustment method further comprises:
   adjusting the receiver gain configuration of the low-noise gain amplifier according to the detection result.

8. The gain adjustment method of claim 6, wherein the step of detecting the power level of the reception signal to generate the detection result comprises:
   determining linearity of power of the reception signal to generate the detection result.

9. The gain adjustment method of claim 8, wherein when the detection result indicates that the power level of the reception signal is non-linear, the transmitter gain configuration is adjusted to decrease the transmitter gain.

10. The gain adjustment method of claim 8, wherein when the detection result indicates that the power level of the reception signal is linear, the transmitter gain configuration is adjusted to increase the transmitter gain.

* * * * *

UNITED STATES PATENT AND TRADEMARK OFFICE
CERTIFICATE OF CORRECTION

| | | |
|---|---|---|
| PATENT NO. | : 8,903,339 B2 | Page 1 of 1 |
| APPLICATION NO. | : 13/609291 | |
| DATED | : December 2, 2014 | |
| INVENTOR(S) | : Su | |

It is certified that error appears in the above-identified patent and that said Letters Patent is hereby corrected as shown below:

On the title page, item (54), and in the specification, col. 1, line 1-5, Title, delete "GAIN ADJUSTMENT DEVICE AND GAIN ADJUSTMENT METHOD CIRCUIT FOR WIRELESS COMMUNICATION CIRCUIT FOR WIRELESS COMMUNICATION CIRCUIT" and insert -- GAIN ADJUSTMENT DEVICE AND GAIN ADJUSTMENT METHOD FOR WIRELESS COMMUNICATION CIRCUIT FOR WIRELESS COMMUNICATION CIRCUIT--.

Signed and Sealed this
Twenty-fifth Day of August, 2015

Michelle K. Lee
*Director of the United States Patent and Trademark Office*